United States Patent
Chen et al.

(10) Patent No.: US 6,503,807 B2
(45) Date of Patent: Jan. 7, 2003

(54) MOS TRANSISTOR WITH TWO EMPTY SIDE SLOTS ON ITS GATE AND ITS METHOD OF FORMATION

(75) Inventors: Chin-Lai Chen, Taoyuan Hsien (TW); Tony Lin, Kaohsiung Hsien (TW); Jih-Wen Chou, Hsin-Chu (TW)

(73) Assignee: United Microelectronics Corp., Hsin-Chu (TW)

( * ) Notice: Subject to any disclaimer, the term of this patent is extended or adjusted under 35 U.S.C. 154(b) by 0 days.

(21) Appl. No.: 09/803,893

(22) Filed: Mar. 13, 2001

(65) Prior Publication Data

US 2002/0132404 A1 Sep. 19, 2002

(51) Int. Cl.$^7$ ............................................. H01L 21/336
(52) U.S. Cl. ........................ 438/305; 438/529; 438/683
(58) Field of Search .................................. 438/305, 529, 438/FOR 188, FOR 193, FOR 199, FOR 420

(56) References Cited

U.S. PATENT DOCUMENTS

| | | | | | |
|---|---|---|---|---|---|
| 5,869,374 A | * | 2/1999 | Wu | ............................ | 438/291 |
| 6,037,202 A | * | 3/2000 | Witek | ......................... | 438/212 |
| 6,114,211 A | * | 9/2000 | Fulford et al. | .............. | 438/303 |
| 6,124,177 A | * | 9/2000 | Lin et al. | ..................... | 257/410 |
| 6,242,348 B1 | * | 6/2001 | Kamal et al. | ................ | 438/592 |
| 6,316,323 B1 | * | 11/2001 | Fang et al. | ................. | 438/299 |
| 6,326,273 B1 | * | 12/2001 | Yu | .............................. | 438/301 |
| 6,344,382 B1 | * | 2/2002 | Wu et al. | .................... | 438/220 |

\* cited by examiner

*Primary Examiner*—Wael Fahmy
*Assistant Examiner*—Michelle Estrada
(74) *Attorney, Agent, or Firm*—Winston Hsu

(57) ABSTRACT

A MOS transistor includes a substrate, an insulation layer, a gate and a dielectric layer. The substrate includes a drain and a source separately positioned on the surface of the substrate. The insulation layer is positioned on the surface of the substrate between the drain and the source. The gate includes a conducting layer positioned on the insulation layer having a bottom side, a top side, a left side and a right side, and a metallic silicide layer positioned on the top side of the conducting layer wherein the width of the metallic silicide layer is greater than that of the bottom side of the conducting layer. The dielectric layer covers the drain, the source and the metallic silicide layer. The transistor includes at least one empty side slot positioned between the dielectric layer and the left side or right side of the conducting layer below the metallic silicide layer.

5 Claims, 5 Drawing Sheets

MOS TRANSISTOR WITH TWO EMPTY SIDE SLOTS ON ITS GATE AND ITS METHOD OF FORMATION

BACKGROUND OF THE INVENTION

1. Field of the Invention

The present invention relates to a MOS transistor, and more particularly, to a MOS transistor with two empty side slots on its gate and its method of formation.

2. Description of the Prior Art

Use of MOS transistors has become a very common practice in the semiconductor industry. There are usually an inordinately high number of MOS transistors on a semiconductor chip. This has led to keen interest in finding effective ways of producing smaller transistors with improved electrical characteristics. Please refer to FIG. 1. FIG. 1 is a sectional diagram of a transistor 10 according to the prior art. The transistor 10 comprises a rectangular gate 14, a drain 16, and a source 18. The gate 14 comprises a conducting layer 15, a metallic silicide layer 20, and two spacers 17 at two sides of the gate 14. Each of the drain 16 and the source 18 comprises a high density doped layer 21, 23, a high doped drain/low doped drain (HDD/LDD) layer 25,27 and a metallic silicide layer 22, 24. Trenches 12 are used to isolate the transistor 10 from other components on the substrate 11 of a semiconductor wafer.

Despite the popularity of the above described transistor structure, problems arise when manufacturing small sized transistors that are less than 0.18 um in size. These problems include:

1. Increase in the cost of a lithographic stepper: Deep UV is the light source in the lithography stepper but interference and diffraction occur with this light source when transistors of less than 0.18 um are processed. Changing to a light source with a reduced wavelength of light may alleviate the problem but this increases costs as well.
2. Difficulty in the formation of metallic silicide: The metallic silicide layers 20, 22, 24 are used to reduce the conductive resistance of the gate 14, drain 16 and source 18 and are formed by reacting metal and silicon on the semiconductor wafer. A common practice is to form Ti-silicide by reacting titanium with the silicon on surfaces of the gate 14, drain 16 and source 18. The reaction requires a certain minimum surface area of silicon. However, At sizes of 0.18 um or less, it becomes exceedingly difficult to form metallic silicide due to insufficient surface area.

SUMMARY OF THE INVENTION

It is therefore a primary objective of the present invention to provide a MOS transistor with two empty side slots on its gate and method for its formation to solve the above mentioned problems.

In a preferred embodiment, the present invention provides a MOS (metal-oxide-semiconductor) transistor comprising:

a substrate having a surface layer which comprises a drain and a source separately positioned on two separate areas of the surface layer;

an insulation layer positioned on the surface of the substrate between the drain and the source;

a gate comprising:

a conducting layer positioned on the insulation layer having a bottom side, a top side, a left side and a right side; and a metallic silicide layer positioned on the top side of the conducting layer for reducing resistance of the conducting layer wherein the width of the metallic silicide layer is greater than that of the bottom side of the conducting layer; and a dielectric layer covered on the drain, the source and the metallic silicide layer;

wherein the transistor comprises at least one side slot positioned between the dielectric layer and the left side or right side of the conducting layer below the metallic silicide layer.

It is an advantage of the present invention that the method for forming the transistor according to the present invention can produce smaller transistors possessing many electrical advantages making this method ideal for processing semiconductors under 0.18 um.

This and other objectives of the present invention will no doubt become obvious to those of ordinary skill in the art after having read the following detailed description of the preferred embodiment which is illustrated in the various figures and drawings.

DETAILED DESCRIPTION OF THE PREFERRED EMBODIMENT

Figure 1:
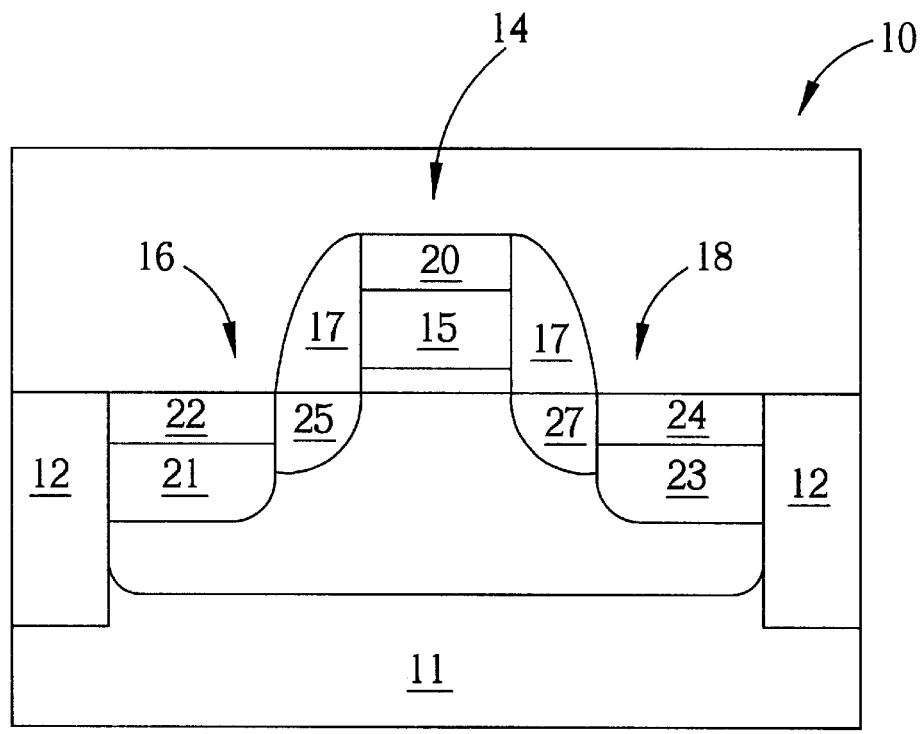
FIG. 1 is a sectional diagram of the structure of a transistor according to the prior art.
Figure 2:
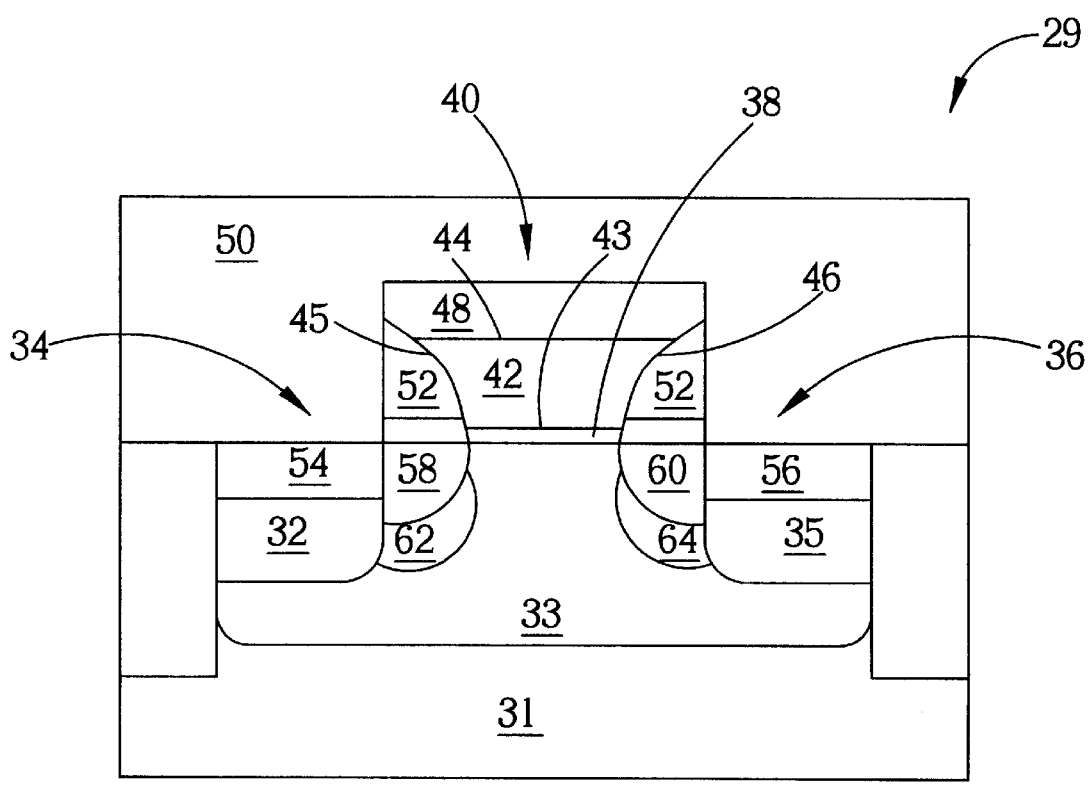
FIG. 2 is a sectional diagram of the structure of a transistor according to the present invention.

Please refer to FIG. 2. FIG. 2 is a sectional diagram of the structure of a transistor 29 according to the present invention. The transistor 29 comprises a substrate 31, an insulation layer 38, a dielectric layer 50 and a gate 40. The gate 40 comprises a conducting layer 42 and a metallic silicide layer 46. The substrate 31 comprises a surface layer on a surface of the substrate 31. The surface layer has a substrate well 33, and a drain 34 and a source 36 separately positioned on two separate areas of the surface layer. The insulation layer 38 is positioned on the surface of the substrate 31 between the drain 34 and the source 36. The conducting layer 42 is positioned on the insulation layer 38 and has a bottom side 43, a top side 44, a left side 45 and a right side 46 wherein the width of the top side 44 is greater than that of the bottom side 43. The metallic silicide layer 48 reduces the resistance of the conducting layer 42 on which it is positioned wherein the width of the metallic silicide layer 48 is greater than that of the bottom side 43 of the conducting layer 42. The dielectric layer 50 covers the drain 34, the source 36 and the metallic silicide layer 48 of the gate 40 and functions as an insulation layer on the outside of the transistor 29. The transistor 29 comprises two empty side slots 52 positioned between the dielectric layer 50 and each of the left and right sides of the conducting layer 42 below the metallic silicide layer 48 and the top side 44.

The drain 34 and the source 36 each comprise a high density doped layer 32, 35, a metallic silicide layer 54, 56 installed on the surface of the high density doped layer 32, 35, a HDD/LDD layer 58, 60 installed on the surface of the substrate well 33 near the gate 40, and a pocket layer 62, 64 installed below the HDD/LDD layer 58, 60 encircling the HDD/LDD layer 58, 60 enabling adjustment of the punch through voltage of the transistor 29. The metallic silicide layer 54, 56 reduces the resistance of the drain 34 and the source 36. The HDD/LDD layer 58, 60 reduces the hot carrier effect of the transistor 29.

Figure 3:
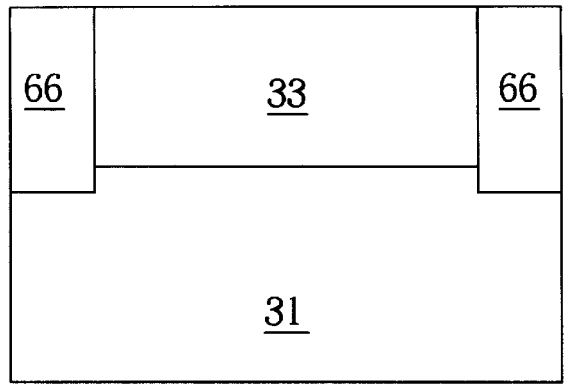
FIG. 3 to FIG. 10 are schematic diagrams of the method of forming the transistor shown in FIG. 2

Please refer to FIG. 3 to FIG. 10. FIG. 3 to FIG. 10 are schematic diagrams of the method of forming the transistor 29 shown in FIG. 2. The method of present invention is used to manufacture a transistor 30 on a semiconductor wafer 29. As shown in FIG. 3, The semiconductor wafer 30 comprises a substrate 31, and a plurality of shallow trenches 66. These shallow trenches 66 electrically isolate components on the wafer 30. The semiconductor wafer 29 further comprises a p-type (or n-type) substrate well 33 positioned on a surface layer of the substrate 31 using ion implantation.

Figure 4:
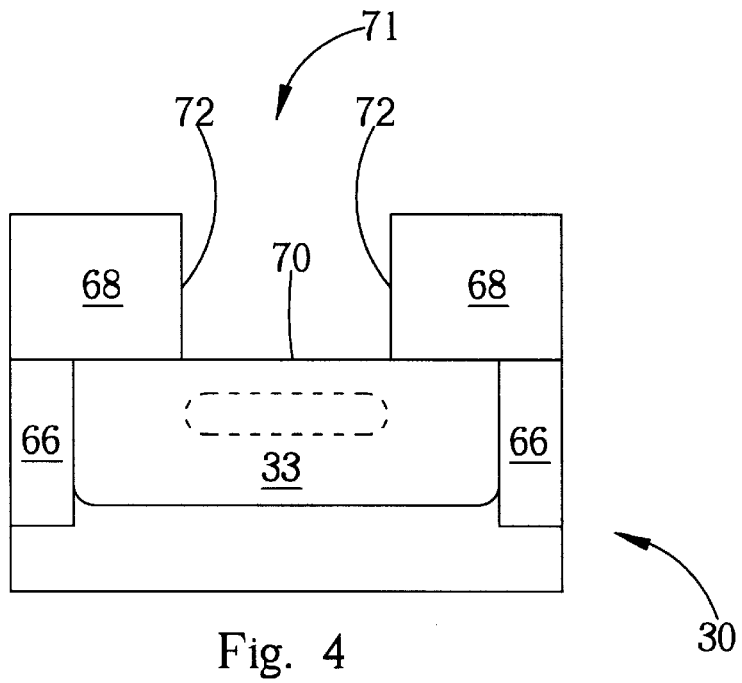

FIG. 4 illustrates the first step in transistor manufacturing of the present invention. A silicon nitride layer 68 is first deposited onto the surface of the semiconductor wafer 30. A vertical trench 71 with a trench bottom 70 and two side walls 72 is then formed down to the wafer surface by removing predetermined areas of the silicon nitride layer 68 by lithography and etching. This is called gate patterning. Next, local implantation is performed which involves adjusting the threshold voltage (Vt) and punch-through voltage (Vp) of the transistor 29 using ion implantation on the trench 71. The dotted region in FIG. 4 represents the area of ion implantation.

Figure 5:
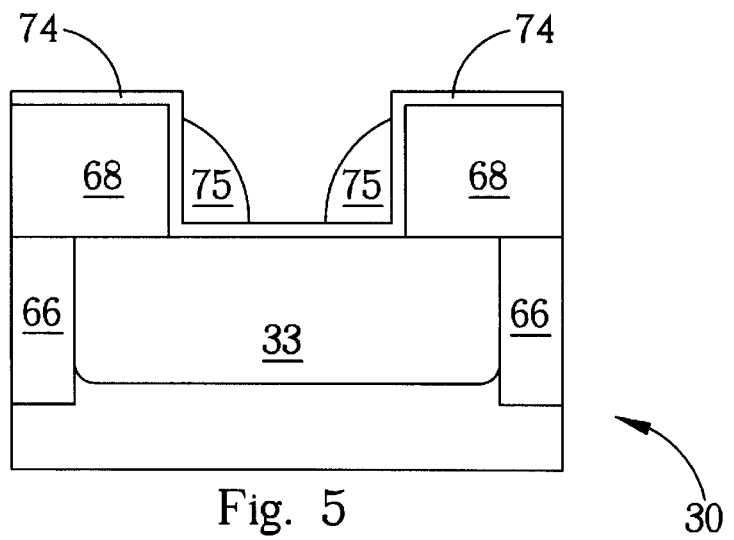

As shown in FIG. 5, a first silicon oxide layer 74 is formed on the surface of the silicon nitride layer 68 and the trench 71 by performing a chemical vapor deposition (CVD) process. Next, two spacers 75 are formed at the intersections of the trench bottom 70 and the two trench side-walls 72. The spacers are made of silicon nitride.

Figure 6:
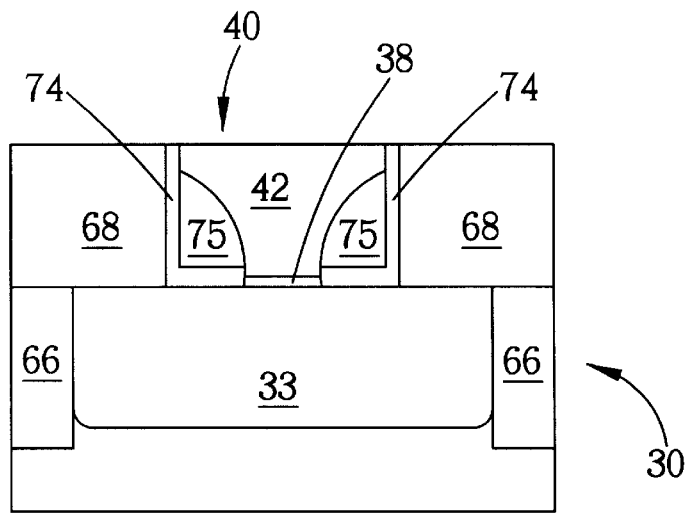

As shown in FIG. 6, the first silicon oxide layer 74 between the trench bottom 70 and the two spacers 75 is removed by performing an oxide dip process. Thermal oxidation is then performed to form an insulation layer 38 which is mainly formed of silicon dioxide in the vacated space. A poly-silicon layer is then deposited on the entire surface of the semiconductor wafer 30 using CVD followed by chemical mechanical polishing (CMP) to remove this layer in all areas outside of the vertical trench 71. This results in the formation of a conducting layer 42 filling the trench 71 that functions as a gate 40 of the transistor 29.

Figure 7:
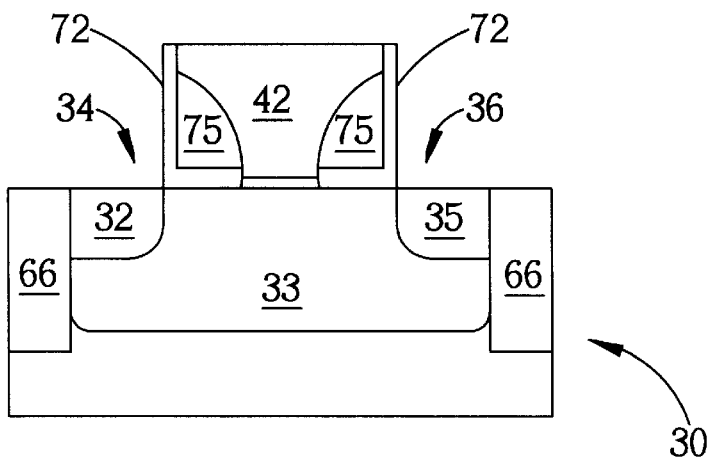

As shown in FIG. 7, the silicon nitride layer 68 is removed with hot phosphoric acid. Ion implantation is then performed in two predetermined areas on the surface of the substrate well 33 of the semiconductor wafer next to the two trench side walls 72. This forms two high density doped layers 32, 35 as a drain 34 and a source 36 of the transistor 29, respectively. This step is called source/drain implantation. The surface of the semiconductor wafer 30 is repaired through a source/drain thermal annealing process on the drain 34 and source 36. Damages from source/drain implantation are repaired as implants from the source/drain implantation process are activated. This process is called S/D annealing.

Figure 8:
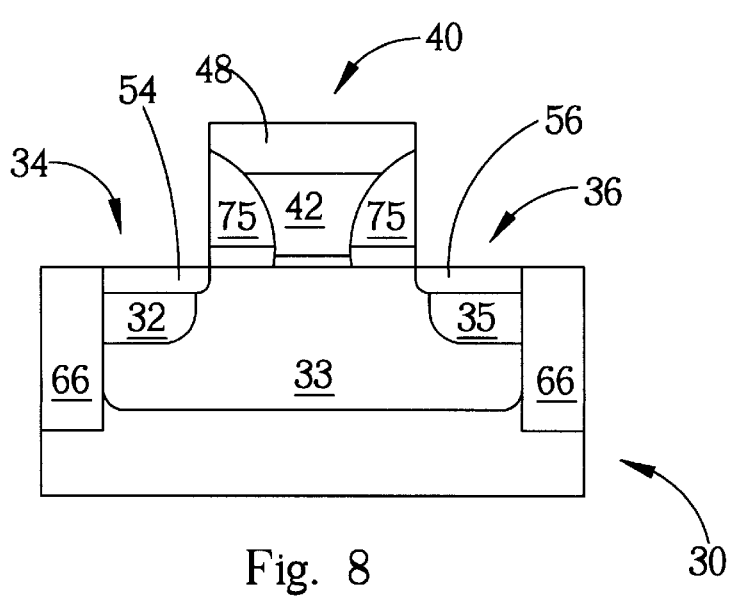

As shown in FIG. 8, the first silicon oxide layer 74 is removed from the two trench side walls 72 by wet etching. This step is also called oxide dip. Using a metallic self-aligned silicidation method, metallic silicide layers 48, 54, 56 are then separately formed on the conducting layer 42, the drain 34 and the source 36, respectively. The metallic silicide layers 48, 54, 56 are made of titanium silicate or Cobalt silicate and are capable of reducing the resistance of the gate 40, the drain 34 and the source 36, respectively.

Figure 9:
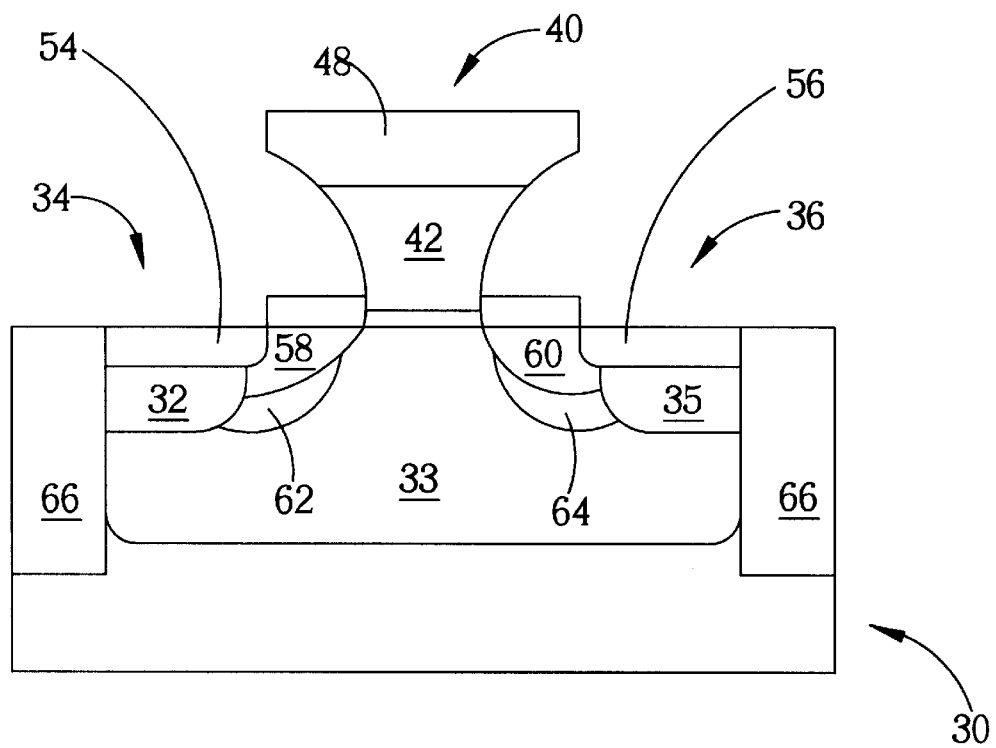

As shown in FIG. 9, the two spacers 75 are removed by wet etching with hot phosphoric acid leaving spaces on the trench bottom. Ion implantation is performed in these areas forming HDD/LDD layers 58, 60 extending from the drain 34 and the source 36 to the areas previously occupied by the two spacers 75. This step is called HDD/LDD implantation. Next, ion implantation is performed again in the areas previously occupied by the two spacers 75. Thus, two pocket layers 62, 64 under the two HDD/LDD layers 58, 60 are formed. This step is called halo implantation. The two pocket layers 62, 64 adjust the punch through voltage of the transistor through their proximity to the two HDD/LDD layers 58, 60. A spike rapid thermal process (RTP) is then performed on the semiconductor wafer 30 to activate the implants of the HDD/LDD implantation and the halo implantation.

Figure 10:
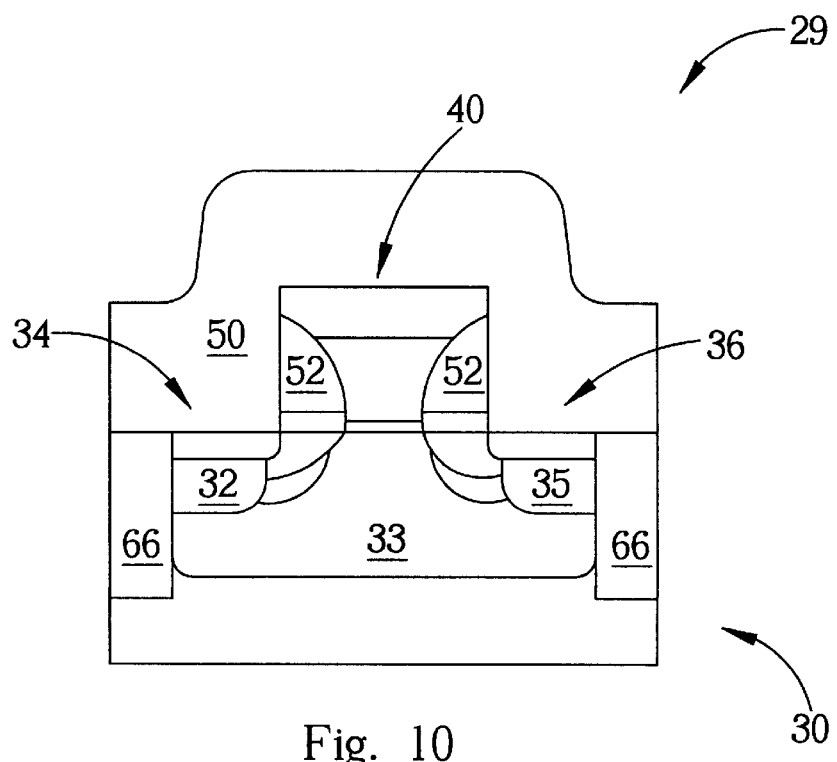

As shown in FIG. 10, borophospho-silicate glass (BPSG) or undoped silicate glass (USG) is deposited on the semiconductor wafer 30 using CVD. A dielectric layer 50 is thus formed over the surface of the gate 40, the drain 34 and the source 36 and two empty slots 52 are formed in the positions previously occupied by the two spacers 75. The conventional name for this step is inter-layer dielectric (ILD) deposition. This completes the process. Because the two side slots 52 are formed in areas formerly occupied by the two spacers 75 prior to etching, the shape of the side slot 52 is similar to that of a spacer 75. The side slot 52 is an empty slot having a dielectric constant approximately equal to 1 for reducing parasitic capacitance between the gate 40 and the drain 34 or between the gate 40 and the source 36.

Figure 11:
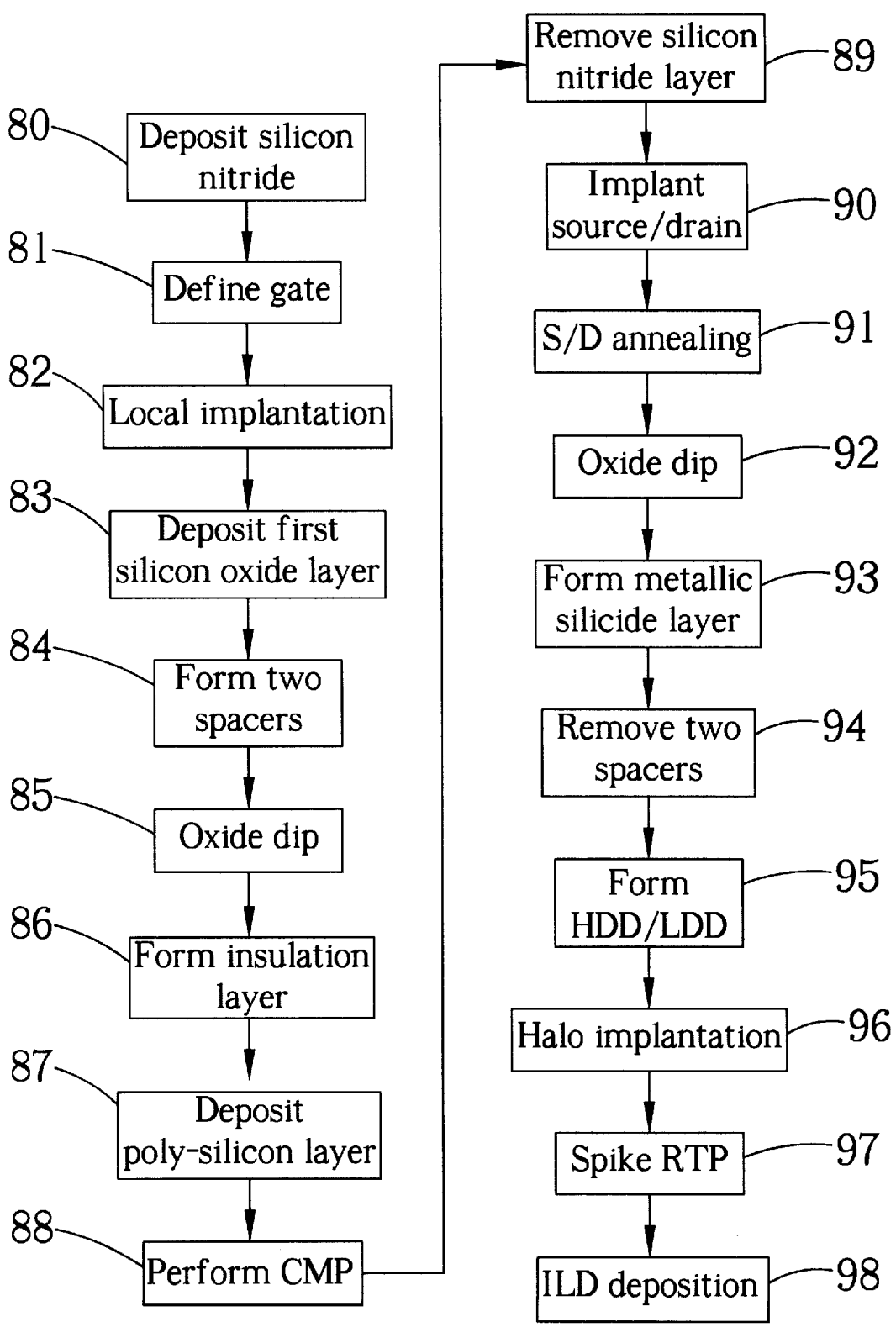
FIG. 11 is a flowchart of the method of forming the transistor shown in FIG. 2.

Please refer to FIG. 11. FIG. 11 is a flowchart of the method of forming the transistor 29 shown in FIG. 2. Summarizing the above processes, after formation of the shallow trench 66 and the p-type (or n-type) substrate well 33 on the semiconductor wafer 30 using STI processing is complete, formation of the transistor 29 of the present invention can proceed. The manufacturing method of the transistor 29 according to the present invention can be briefly depicted as follows:

Step 80: Depositing silicon nitride to form a silicon nitride layer 68;
Step 81: Defining the gate 40 and the vertical trench 71 on the silicon nitride layer 68;
Step 82: Performing local implantation;
Step 83: Depositing the first silicon oxide layer 74,
Step 84: Forming the two spacers 75;
Step 85: Performing oxide dip;
Step 86: Forming the insulation layer 38;
Step 87: Depositing the poly-silicon layer;
Step 88: Performing Poly-silicon CMP and removing the poly-silicon layer outside the trench 71 to form the gate 40;
Step 89: Removing the silicon nitride layer 68;
Step 90: Performing source/drain implantation to form the drain 34 and the source 36;
Step 91: Performing SID annealing;
Step 92: Performing oxide dip;
Step 93: Forming the metallic silicide layer;
Step 94: Removing the two spacers 75;
Step 95: Performing HDD/LDD implantation to form the HDD/LDD layers 58, 60;
Step 96: Performing Halo implantation to form the two pocket layers 62, 64;
Step 97: Performing spike RTP;
Step 98: Performing ILD deposition.

There are many advantages to the structure and manufacturing method of the transistor 29 of the present invention, such as:

1. The parasitic capacitance between the gate 40 and drain 34 and between the gate 40 and source 36 is reduced. The capacitance between the gate 40 and the drain 34 or the gate 40 and the source 36 depends on the intervening material. The higher the dielectric constant, the slower the response of the electric signals. Because the transistor 29 of the present invention has empty side slots 52 whose dielectric constant is approximately equal to 1 which is the minimum possible value, the parasitic capacitance can be correspondingly smaller and the response of the electric signals can be accelerated.
2. The parasitic capacitance of the source 36 and the drain 34 to the substrate well 33 can be inhibited. Local implantation allows adjustment of the Vt and Vp of the transistor 29. The implants from local implantation would be restricted to the substrate well 33 under the gate 40 (as shown in FIG. 4, the area enclosed by the dotted line is the ion implantation area), and would not extend to the substrate under the drain 34 and the source 36. Therefore, local implantation not only adjusts the Vt and vp of the transistor 29 effectively but also inhibits the parasitic capacitance between the source 36 and the substrate well 33 or between the drain 34 and the substrate well 33 from becoming excessive.
3. The lithography stepper does not have to be replaced along with changes and advancements in the process. To define the gate 40 of the transistor 29, the trench 71 can be defined by using a mask and a lithographic stepper with line width of 0.2 um. By adjusting the manufacturing process of the spacers 75, the line width of the bottom side 43 of the conducting layer 42 can be controlled at about 0.1 um thus forming a smaller transistor.
4. The metallic silicide is easy to form. The top side of conducting layer 42 of the gate 40 is larger than the bottom side prior to formation of the metallic silicide layer 48 and the bottom side 43 of the conducting layer 42 has a line width of 0.1 um. So when forming the metallic silicide layer 48, the surface line width of the conducting layer 42 of the gate 40 is larger than 0.1 um and may even be as large as 0.2 um facilitating the formation of the metallic silicide layer with this line width.
5. The short channel effect can be inhibited. At high temperature, the common HDD/LDD structure will diffuse causing the short channel effect to occur under the gate insulation layer 38. The HDD/LDD layers 58, 60 of the present invention are formed after removal of the spacers 75 (steps 94, 95). The HDD/LDD layers 58, 60 are exposed only to spike RTP (step 97) and are not affected by exposure to high temperatures for long periods of time (such as in step 91). Therefore, diffusion of the HDD/LDD layers 58, 60 at high temperatures is reduced thus lengthening the channel under the gate insulation layer 38. In this way, the present invention can inhibit the short channel effect.

In contrast to the MOS transistor 10 according to the prior art, the width of the top side of the conducting layer in the transistor 29 according to the present invention is larger than that of the bottom side. The width of the metallic silicide layer of the gate is likewise larger than the bottom side of the conducting layer. Also, there are two empty side slots on the transistor 29. These structures give the present invention many advantages in terms of electrical characteristics and manufacturing. The method for forming the transistor 29 according to the present invention produces smaller transistors without the need for a new apparatus. Also, the transistors 29 possess many electrical advantages making this method very suitable for processing semiconductors under 0.18 um.

Those skilled in the art will readily observe that numerous modifications and alterations of the device may be made while retaining the teaching of the invention. Accordingly, the above disclosure should be construed as limited only by the metes and bounds of the appended claims.

What is claimed is:

1. A method of forming a MOS transistor comprising:
   forming a silicon nitride layer on a surface of a semiconductor wafer;
   forming a vertical trench on the silicon nitride layer which is down to the surface of the semiconductor wafer, the trench having a trench bottom and two trench side walls;
   forming a first silicon oxide layer on the surface of the trench;
   forming two spacers at two corners between the trench bottom and the two trench side walls;
   removing the first silicon oxide layer positioned over the trench bottom between the two spacers and forming an insulation layer in an area where the first silicon oxide layer was removed;
   forming a conductive layer to cover the surface of the silicon nitride layer and the trench;
   removing the conductive layer and the first silicon oxide layer on the surface of the silicon nitride layer outside the trench by using a chemical mechanical polishing (CMP) method to form a gate of the transistor;
   removing the silicon nitride layer from the surface of the semiconductor wafer;
   performing ion implantation in two predetermined areas on the surface of the semiconductor wafer next to the two trench side walls to form a drain and a source of the transistor;
   removing the first silicon oxide layer positioned over the two trench side walls;
   removing the two spacers;
   performing ion implantation over the two spots on the trench bottom which are previously occupied by the two spacers to extend the drain and the source; and
   forming two empty slots in the positions previously occupied by the two spacers by covering the surfaces of the gate, drain, and source with a dielectric layer, thus reducing parasitic capacitances between the gate and the drain, and, between the gate and the source.

2. The method of claim 1 wherein the two spacers are formed by silicon nitride.

3. The method of claim 1 wherein after forming the drain and source of the transistor, the method further comprising:
   performing a thermal annealing process to repair wafer damages caused by the ion implantation and to activate the implanted implants.

4. The method of claim 1 wherein before removing the two spacers, the method further comprises the following step:
   forming a metallic silicide layer on the surfaces of the conductive layer of the gate, the drain and the source to reduce their resistances.

5. The method of claim 1 wherein after performing the ion implantation over the two spots on the trench bottom previously occupied by the two spacers, the method further comprises the following step:
   performing a thermal annealing process to activate the implanted implants.

* * * * *